United States Patent
Kwon et al.

(10) Patent No.: US 12,396,607 B2
(45) Date of Patent: Aug. 26, 2025

(54) VACUUM CLEANER CAPABLE OF POWER LINE COMMUNICATION

(71) Applicant: LG ELECTRONICS INC., Seoul (KR)

(72) Inventors: Sun Ku Kwon, Seoul (KR); Cha Seung Jun, Seoul (KR); Sung Yong Shin, Seoul (KR); Se Hwa Choe, Seoul (KR); Dong Hyun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 449 days.

(21) Appl. No.: 17/910,866

(22) PCT Filed: Nov. 11, 2020

(86) PCT No.: PCT/KR2020/015766
§ 371 (c)(1),
(2) Date: Sep. 12, 2022

(87) PCT Pub. No.: WO2021/230446
PCT Pub. Date: Nov. 18, 2021

(65) Prior Publication Data
US 2023/0104985 A1    Apr. 6, 2023

(30) Foreign Application Priority Data

May 12, 2020    (KR) .................. 10-2020-0056558

(51) Int. Cl.
*A47L 9/28* (2006.01)

(52) U.S. Cl.
CPC ........... *A47L 9/2894* (2013.01); *A47L 9/2805* (2013.01); *A47L 9/2842* (2013.01)

(58) Field of Classification Search
CPC .... A47L 9/2894; A47L 9/2842; A47L 9/2847; A47L 9/0072; A47L 9/2805
See application file for complete search history.

(56) References Cited

U.S. PATENT DOCUMENTS 9,301,665 B2    4/2016   Clothier et al.
2014/0223688 A1  8/2014   Reindle et al.
(Continued)

FOREIGN PATENT DOCUMENTS

JP    H 09-075279    3/1997
JP    2008-113961    5/2008
(Continued)

OTHER PUBLICATIONS

International Search Report dated Feb. 19, 2021 issued in Application No. PCT/KR2020/015766.
(Continued)

*Primary Examiner* — Andrew A Horton
(74) *Attorney, Agent, or Firm* — KED & ASSOCIATES, LLP

(57) ABSTRACT

Provided is a vacuum cleaner, including a main body including a power supply part configured to supply power, a first motor configured to generate suction force, and a first printed circuit board (PCB) on which the first controller is mounted, and a nozzle including a cleaning part, a second motor configured to drive the cleaning part and a second PCB equipped with a second controller, the nozzle configured to suck air containing foreign substances by the suction force, wherein a first power line communication from the first controller to the second controller is voltage pulse width modulation (PWM), and a second power line communication from the second controller to the first controller is a current shaping method.

20 Claims, 10 Drawing Sheets

(56) References Cited

U.S. PATENT DOCUMENTS

2017/0042400 A1    2/2017  Lee et al.
2017/0288436 A1*   10/2017 Reed ................. H01M 10/4257

FOREIGN PATENT DOCUMENTS

| | | |
|---|---|---|
| JP | 2009-017920 | 1/2009 |
| KR | 10-0798325 | 1/2008 |
| KR | 10-2016-0019932 | 2/2016 |
| KR | 10-2017-0019890 | 2/2017 |
| KR | 10-2020-0035734 | 4/2020 |
| KR | 10-2020-0039348 | 4/2020 |
| WO | WO 2014/199139 | 12/2014 |

OTHER PUBLICATIONS

Korean Office Action dated Jan. 26, 2022 issued in Application No. 10-2020-0056558.
Korean Office Action dated May 23, 2022 issued in Application No. 10-2022-0047677.
Korean Notice of Allowance dated Jan. 26, 2022 issued in Application No. 10-2020-0056558.
A spread spectrum communication system for load management and distribution automation, IEEE Transactions on Power Delivery, vol. 4, No. 1, Jan. 1989, pp. 75-81, W. Hagmann.
Feasibility of a high-bit-rate power-line communication between an inverter and a motor, Transactions on Industrial Electronics, vol. 61, No. 9, Sep. 2014, pp. 4816-4823, Virginie Dégardin.
Chinese Office Action dated Jun. 30, 2023 issued in Application No. 202080100704.X.

* cited by examiner

VACUUM CLEANER CAPABLE OF POWER LINE COMMUNICATION

CROSS-REFERENCE TO RELATED PATENT APPLICATIONS

This application is a U.S. National Stage Application under 35 U.S.C. § 371 of PCT Application No. PCT/KR2020/015766, filed Nov. 11, 2020, which claims priority to Korean Patent Application No. 10-2020-0056558, filed May 12, 2020, whose entire disclosures are hereby incorporated by reference.

TECHNICAL FIELD

This disclosure relates a vacuum cleaner in which power line communication is performed between a main body and a nozzle.

BACKGROUND ART

A vacuum cleaner is a device that performs cleaning by sucking or wiping dust or foreign substances in an area to be cleaned.

Such a vacuum cleaner may be divided into a manual cleaner that a user directly moves to perform cleaning, and an automatic cleaner that the user performs cleaning while the automatic cleaner driving by itself.

Further, manual vacuum cleaners may be classified into canister-type cleaners, upright-type cleaners, handy-type cleaners and stick-type cleaners, depending on the shape of the cleaner.

Such a manual vacuum cleaner may include a stick that sucks in foreign substances through a nozzle, communicates with the nozzle, adjusts the length and provides a passage for foreign substances, a motor that provides power to suck foreign substances, a state determining part that determines states of the moving speed and the direction of the head, and a controller that controls the output of the motor.

A user may attach and detach a main body including a motor that provides suction force and a nozzle. The type of the detachable cleaner head may be varied according to the use.

In the case of using a vacuum cleaner, the power to suck foreign substances may be adjusted by changing an operation state of the nozzle according to a user's motion, and in order to achieve the target suction amount, the suction power of the motor may be adjusted according to the state of the nozzle.

For example, when the vacuum cleaner is quickly moved in a state in which the motor output is constant, the amount of sucked foreign substances may be reduced compared to a case of moving the cleaner slowly, and if foreign substances adhere to the nozzle and interfere with the operation of the cleaning part, the amount of sucked foreign substances may be decreased.

Therefore, it may be required to allow the nozzle to be driven in an operating state desired by the user through information exchange between the main body and the nozzle of the cleaner or to control the motor included in the main body adaptively to the cleaning environment. However, in order to perform a separate wired/wireless communication protocol (for example, wired communication, radio frequency (RF), ZigBee, Bluetooth and Wi-Fi) between various components included in a cleaner, additional writing is required in an conventional cleaner constitution, and thus structural limitations and cost constrains exist.

DISCLOSURE OF INVENTION

Technical Goals

An aspect provides a vacuum cleaner capable of transmitting and receiving a predetermined signal between a body and a head through a power line communication method rather than a wired/wireless communication method that requires additional wiring.

Technical Solutions

According to an aspect, there is provided a vacuum cleaner, including a main body including a power supply part configured to supply power, a first motor configured to generate suction force, and a first printed circuit board (PCB) on which the first controller is mounted, and a nozzle including a cleaning part, a second motor configured to drive the cleaning part and a second PCB equipped with a second controller, the nozzle configured to suck air containing foreign substances by the suction force, wherein a first power line communication from the first controller to the second controller is voltage pulse width modulation (PWM), and a second power line communication from the second controller to the first controller is a current shaping method.

Effects

According to example embodiments, provided is a vacuum cleaner that allows communication between a main body and a head without using a wired/wireless communication method that requires additional wiring in a situation where it is difficult to add additional hardware and has structural limitations.

According to example embodiments, provided is a vacuum cleaner capable of transmitting and receiving signals between a main body and a head even when a low-specification controller is used.

BEST MODE FOR CARRYING OUT THE INVENTION

Figure 1:
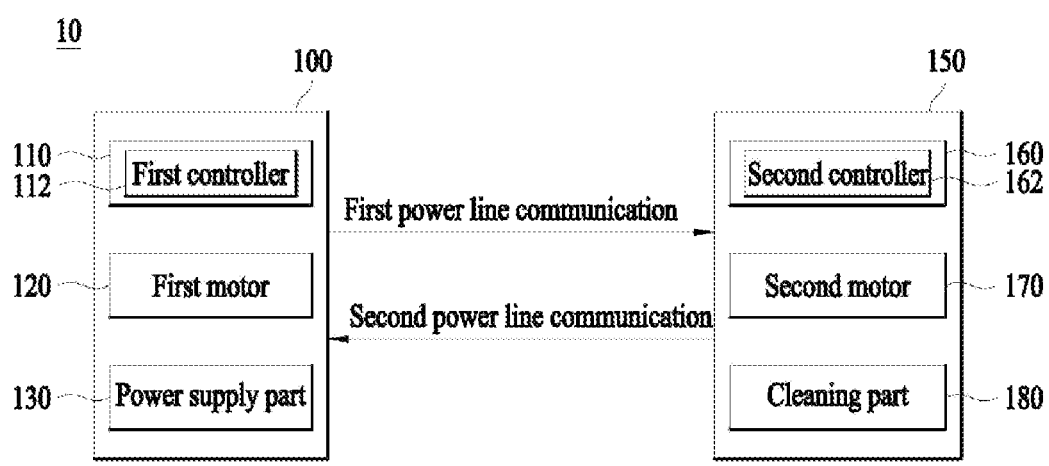
FIG. 1 is a block diagram of a vacuum cleaner in which a main body and a head communicate through a power line communication method according to an example embodiment.

According to an example embodiment, provided is a vacuum cleaner, including a main body including a power supply part configured to supply power, a first motor configured to generate suction force, and a first PCB on which the first controller is mounted, and a nozzle including a cleaning part, a second motor configured to drive the cleaning part and a second PCB equipped with a second controller, the nozzle configured to suck air containing foreign substances by the suction force, wherein a first power line communication from the first controller to the second controller is voltage PWM, and a second power line communication from the second controller to the first controller is a current shaping method.

According to an example embodiment, the first power line communication may be a method of modulating a frequency of a voltage transmitted from the first controller to the second controller.

According to an example embodiment, the second power line communication may be a method of modulating at least one of a magnitude and a frequency of a current transmitted from the second controller to the first controller.

According to an example embodiment, the first controller may be configured to control at least one of an operation of the second motor and an operation of the cleaning part through the first power line communication.

According to an example embodiment, the second controller may be configured to transmit at least one among operation state information of the second motor, operation state information of the cleaning part and information indicating that control operation received from the first controller is completed, to the first controller through the second power line communication.

According to an example embodiment, the first controller may be configured to adjust a duty rate of a voltage PWM signal input to the nozzle to compensate for decrease in a magnitude of a voltage of the power supply part.

According to an example embodiment, the first controller may be configured to adjust the duty rate of the voltage PWM signal in inverse proportion to the magnitude of the voltage of the power supply part.

According to an example embodiment, the second controller may be configured to determine a duty rate of a received voltage based on a number of clock signals counted between times of a change of an input voltage.

According to an example embodiment, the first PCB may further include a filter for filtering a signal received through the second power line communication, and the filter may be a low pass filter for passing a frequency band used in the second power line communication.

According to an example embodiment, the second motor may be a DC motor, and the second controller may be configured to perform the second power line communication based on an instantaneous value of a voltage input to the second motor.

According to an example embodiment, the second controller may be configured to drive the second motor based on an average value of voltages input to the second motor.

According to an example embodiment, the second motor may be an AC motor, and the second controller may be configured to perform the second power line communication by adding a current ripple to a current input to the second motor to change a magnitude and a frequency of a driving current of the AC motor from a DC component signal to an AC component signal.

According to an example embodiment, the first controller may be configured to perform the first power line communication based on a trigger signal, and the trigger signal may include at least one of a signal input by a user and a recognition signal generated by a state change of the vacuum cleaner.

According to an example embodiment, the second controller may be configured to perform the second power line communication in order to transmit information indicating a performance state of an operation corresponding to information received through the first power line communication.

According to an example embodiment, the first controller may be configured to perform the first power line communication at a predetermined time interval, and the second controller may be configured to perform the second power line communication in order to transmit information indicating a performance state of an operation corresponding to information received through the first power line communication.

According to an example embodiment, the second controller may be configured to perform the second power line communication based on whether a predetermined condition associated with the nozzle is satisfied.

According to an example embodiment, the first controller and the second controller may be configured to execute the first power line communication and the second power line communication in a time division manner.

Hereinafter, implementations of the present disclosure will be described in detail with reference to the drawings so that those skilled in the art to which the present disclosure pertains can easily perform the present disclosure. The present disclosure may be implemented in many different forms and is not limited to the implementations described herein.

For brevity of description, a part that is not related to the description may be omitted, and the same or similar components are denoted by the same reference numerals throughout the specification. Further, some implementations of this application will be described in detail with reference to exemplary drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

In implementing the present disclosure, it will be further understood that the terms "comprise", "include", or "have" when used herein, specify the presence of stated features, integers, steps, operations, elements, and/or components, but do not preclude the presence or addition of one or more other features, integers, steps, operations, elements, components, and/or groups thereof.

Further, in implementing the present disclosure, for convenience of explanation, components may be described by being subdivided; however, these components may be implemented in a device or a module, or a single component may be implemented by being divided into a plurality of devices or modules. Hereinafter, an electronic apparatus according to the example embodiments will be described.

Hereinafter, a vacuum cleaner according to the example embodiments will be described.

FIG. 1 is a block diagram of a vacuum cleaner 10 in which a main body and a head communicate through a power line communication method according to an example embodiment.

The vacuum cleaner 10 includes a main body 100 including a power supply part 130 configured to supply power, a first motor 120 configured to generate suction force and a first PCB 110 on which a first controller 112 is mounted, and a nozzle 150 that includes a cleaning part 180, a second motor 170 to drive the cleaning part 180, and a second PCB 160 on which a second controller is mounted, and nozzle 150 is configured to suck in air containing foreign substances by suction force. According to the example embodiment, the first power line communication from the first controller 112 to the second controller 162 may be a voltage PWM, and the second power line communication from the second controller 162 to the first controller 112 may be a current shaping method.

According to the example embodiment, the first controller 162 may be configured to control at least one of an operation of the second motor 170 and an operation of the cleaning part 180 through the first power line communication.

According to the example embodiment, the second controller 162 may be configured to transmit at least one among operation state information of the second motor 170, operation state information of the cleaning part 180 and information indicating that the control operation received from the first controller 162 is completed, to the first controller 162 through the second power line communication.

According to the example embodiment, the nozzle 150 is a part that sucks external foreign substances in the vacuum cleaner 10. The nozzle 150 may suck the foreign substances in close contact with or close to an area where the foreign substances are located in a space to be cleaned. According to the example embodiment, the first motor 120 may provide a force to suck foreign substances to the nozzle 150. When the first motor 120 operates, the force to suck foreign substances may be generated in the nozzle 150, and foreign substances may be sucked into the nozzle 150 and stored in a foreign substance storage device.

By a user's manipulation, the nozzle 150 may suck in foreign substances while moving on a portion where foreign substances are located.

According to the example embodiment, the nozzle 150 may be connected to the main body 100 through a stick (not illustrated). The stick (not illustrated) may communicate with the nozzle 150, and may provide a passage through which the sucked foreign substances move. The foreign substances sucked into the nozzle 150 may pass through the stick (not illustrated) to reach the foreign substance storage device. The length of the stick (not illustrated) may be adjusted, so that user may use the vacuum cleaner comfortably.

According to the example embodiment, the first controller 112 may be connected to the first motor 120 and control an output of the first motor 120. In the example embodiment, the output of the first motor 120 needs to be properly controlled. If the output of the first motor 120 is insufficient, the power to suck foreign substances may be lowered, so that the efficiency of the cleaner may decrease or the cleaning time may increase. If the output of the first motor 120 is excessive, more power than necessary may be consumed. In particular, when the power supply part 130 of the vacuum cleaner 10 corresponds to a battery, when the output of the first motor 120 is excessive, power consumption increases and the cycle to charge the battery is shortened, which may cause inconvenience to a user. Therefore, the first motor 120 needs to have an appropriate output so that the nozzle 150 has sufficient power to suck foreign substances and at the same time reduces power consumption.

According to the example embodiment, the amount of foreign substances suctioned by the nozzle 150 may vary depending on the type of the cleaner, the capacity of the first motor 120, the size of the cleaner and other various factors. In particular, depending on the environment in which the nozzle 150 sucks foreign substances, the actual suction amount of foreign substances may be different from the target suction amount set by a user due to the load applied to the cleaning part 180. In this case, user inconvenience may be caused. Therefore, it may be required to transmit information on the state of the nozzle 150 to the main body 100 through power line communication between the main body 100 and the nozzle 150 or in order for the main body 100 to change the suction amount of foreign substances according to the state of the nozzle 150. In addition, between the main body 100 and the nozzle 150, the desired use of the vacuum cleaner 10 may be achieved through communication of various information such as a command by a user, state information, acknowledge of receipt of command and so on.

According to the example embodiment, the second motor 170 included in the nozzle 150 may be configured to remove foreign substances through the cleaning part 180. According to the example embodiment, the cleaning part 180 may include various components configured to clean surfaces to clean by removing foreign substances, such as a rotation shaft formed long left and right, a brush part including a brush protrudingly disposed on the outer periphery of the rotation shaft, a rotating cleaning part provided to rotate parallel to a surface to clean, and a suction flow path for sucking air and foreign substances according to the force supplied by the first motor 120 to suck the foreign substances.

According to the example embodiment, the second motor 170 may include at least one motor for driving the cleaning part 180. For example, the second motor 170 may include a motor for driving the rotating cleaning part, a pump or a spray nozzle for discharging water to the cleaning part 180.

According to the example embodiment, in the process of removing foreign substances from the nozzle 150 through the cleaning part 180, depending on the foreign substances or the cleaning environment, the load applied to the cleaning part 180 may decrease the efficiency of removing the foreign substances. The second controller 162 may measure the load applied to the cleaning part 180 to determine whether the cleaning part 180 is being driven according to a target.

According to the example embodiment, the vacuum cleaner 10 may further include an additional sensor for detecting the driving speed of the cleaning part 180, and the second controller 162 may determine the state information of the nozzle 150 by comparing the speed of the cleaning part 180 sensed by the sensor and the speed corresponding to the operation command received from the main body 100, and transmit the information to the main body 100.

According to the example embodiment, the second controller 162 may sense a current flowing through the second motor 170. According to the example embodiment, the second controller 1620 may determine the state information of the nozzle 150 by determining whether the result of sensing the current flowing through the second motor 170 is equal to or greater than a predetermined threshold current value, and may transmit the information to the main body 100 through the second power line communication.

According to the example embodiment, the second controller 162 may stop the operation of the second motor 170 when the sensed current of the second motor 170 is less than a threshold current value. According to the example embodiment, when the detected current of the second motor 170 is less than the threshold current value, and the time detected to be less than the threshold current value is greater than or equal to predetermined threshold time, the second controller 162 may stop the operation of the second motor 170. According to the example embodiment, when the operation state of the nozzle 150 is changed by the operation of the second controller 162, information on the second changed state of the nozzle 150 may be transmitted to the main body 100. However, the information indicating the operation state of the nozzle 150 does not need to be interpreted as being limited to the example embodiment, and various information indicating the current state and state change of the nozzle 150 may be transmitted/received through the power line communication.

According to the example embodiment, by the first power line communication and the second power line communication performed by the first controller 112 and the second controller 162, the vacuum cleaner 10 may not require additional wiring for separate wireless communication between the main body 100 and the nozzle 150. That is, power may be supplied from the main body 100 to the nozzle 150 through the power supply part 130 to drive the second motor 170 and/or the cleaning part 180, and communication between the main body 100 and the nozzle 150 may be implemented through a power line for supplying such power. Power line communication is to transmit and receive information using a power line, and various speed communication technologies for controlling home appliances or transmitting and receiving information required for home networking and multimedia networks have been proposed. In the power line communication, a data signal may be modulated into a specific signal (for example, a high-frequency signal) and transmitted on a line carrying an AC current. The power line communication has the advantage of being able to build a communication network at low cost without installing a special additional communication line using an already secured power line.

According to the example embodiment, the first power line communication and the second power line communication are different communication methods. According to the example embodiment, in order to transmit a signal through the first power line communication, the first controller 112 may modulate a voltage to be transmitted to the nozzle 150 by using a voltage PWM. According to the example embodiment, the first controller 112 may modulate the frequency of the voltage to be transmitted to the nozzle 150 through the voltage PWM.

According to the example embodiment, the first controller 112 may communicate with the second controller 162 by presetting a relationship between the frequency band of the voltage PWM signal and information indicated by the frequency.

According to the example embodiment, the first controller 112 may modulate the frequency of the voltage based on a predetermined frequency for changing the operating speed of the second motor 170. For example, a signal for setting the motor speed of the second motor 170 to the first speed may be a voltage modulated with a frequency of 1.2 kHz, and a signal for setting the motor speed of the second motor 170 to the second speed may be a voltage modulated with a frequency of 1.5 kHz.

According to the example embodiment, the first controller 112 may modulate the frequency of the voltage based on a predetermined frequency for changing the operating speed of the cleaning part 180. For example, a signal to set the operation of the cleaning part 180 on may be a voltage modulated with a frequency of 1.1 kHz, and a signal to set the operation of the cleaning part 180 off may be a voltage modulated with a frequency of 1.4 kHz.

However, the command operation or frequency indicated by the above frequency-modulated signal is merely an example for explaining the first power line communication method of the voltage PWM method, and thus the relationship between the specific operation and the frequency need not be interpreted as being limited to the above.

According to the example embodiment, the second controller 162 may communicate with the first controller 112 through a current modulated at least one of a magnitude and a frequency through the current shaping method.

According to the example embodiment, the second controller 162 may communicate with the first controller 112 by presetting a frequency band indicated by the frequency of the current flowing from the nozzle 150 to the main body 100.

According to the example embodiment, the second controller 162 may modulate the frequency of the current based on a predetermined frequency for transmitting the operating state of the second motor 170 to the main body 100. For example, a signal for indicating that the motor of the second motor 170 is operating at the first speed may be a current modulated with a frequency of 150 kHz, and a signal for indicating that the motor of the second motor 170 is operating at the second speed may be a current modulated with a frequency of 250 kHz.

According to the example embodiment, the second controller 162 may modulate the frequency of the current based on a predetermined frequency for transmitting the operation state of the cleaning part 180 to the main body 100. For example, a signal for indicating that the cleaning part 180 is on may be a current modulated with a frequency of 100 kHz, and a signal for indicating that the cleaning part 180 is off may be a current modulated with a frequency of 200 kHz.

However, the information indicated by the above frequency-modulated signals is merely an example for explaining the second power line communication method of the current shaping method, and thus the relationship between the specific operating state and the frequency need not be interpreted as being limited to the above.

According to the example embodiment, the first power line communication and the second power line communication may be implemented in a time division communication method. According to the example embodiment, the first power line communication and the second power line communication may be implemented in a manner having any communication protocol in which a power line communication signal transmitted from the first controller 112 and the second controller 162 does not occupy a power line (2-Wire) at the same time, and has a predetermined signal transmission order. Accordingly, in the power line communication process between the main body 100 and the nozzle 150, a transmission/reception signal does not always occupy the power line and may be used for intermittent communication only when necessary.

According to the example embodiment, the first power line communication and the second power line communication may be implemented in an asynchronous communication manner. According to the example embodiment, it is not required to share a clock signal through the first power line communication and the second power line communication that are asynchronously performed, for synchronizing timing points for signal transmission and reception between the main body 100 and the nozzle 150. As the asynchronous communication method is implemented, the main body 100 and the nozzle 150 do not need to match each work-processing unit at the same time. Thus, the main body 100 and the nozzle 150 may not match the processing time based on a signal transmitted and received through power line communication, and the operation of the vacuum cleaner 10 may be efficiently performed.

According to the example embodiment, the first power line communication and the second power line communication may be implemented in an asymmetric communication method. According to the example embodiment, the first power line communication uses a voltage PWM and the second power line communication uses a current shaping method, and thus when the magnitude and/or frequency of the current is changed for the implementation of the current shaping method, there is no need to provide a separate additional switch element for power line communication.

According to the example embodiment, the current shaping method may be defined as a method in which mutual communication is performed based on a predetermined frequency for a signal recognized by the receiving side and preset information corresponding thereto by modulating the magnitude and/or frequency of the transmitted/received current.

Figure 2:
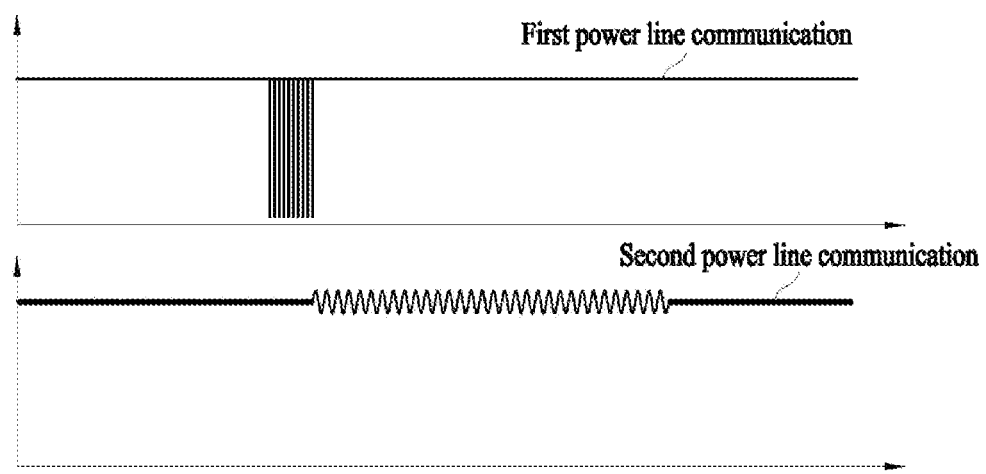
FIG. 2 illustrates a process of transmitting a signal from a nozzle to the main body through a second power line communication when a signal is transmitted from the main body to the nozzle through a first power line communication according to an example embodiment.

FIG. 2 illustrates a process of transmitting a signal from the nozzle to the main body through a second power line communication when a signal is transmitted from the main body to the nozzle through a first power line communication according to the example embodiment.

Referring to FIG. 2, the first controller 112 may transmit a predetermined signal to the second controller through the first power line communication. According to the example embodiment, the frequency modulation of the voltage may be performed when a voltage PWM is performed due to the first power line communication. The second controller 162 may receive the voltage PWM and may control the operation of the nozzle 150 based on the received voltage signal.

According to the example embodiment, the signal received by the second controller 162 through the first power line communication may be a signal for controlling the operation of the second motor 170 and/or the cleaning part 180.

According to the example embodiment, the first controller 112 may be configured to perform the first power line communication based on a trigger signal, and the trigger signal may include at least one of a signal input by a user and a recognition signal generated by a state change of the vacuum cleaner 10.

According to the example embodiment, the second controller 162 may be configured to perform the second power line communication in order to transmit information indicating a performance state of an operation corresponding to the information received through the first power line communication.

According to the example embodiment, the second controller 162 may perform second power line communication to transmit a signal indicating that the operation of the second motor 170 and/or the cleaning part 180 is completed to the first controller 112 based on receiving the voltage PWM signal form the first controller 112.

According to the example embodiment, the second controller 162 may perform the second power line communication to transmit an acknowledge signal indicating that the voltage PWM signal is received from the first controller 112 to the first controller 112.

According to the example embodiment, the first controller 112 may be configured to perform the first power line communication at a predetermined time interval, and the second controller 162 may be configured to perform the second power line communication in order to transmit information indicating a performance state of an operation corresponding to the information received through the first power line communication. According to the example embodiment, by regularly performing the first power line communication at a predetermined time interval, the main body 100 may acquire predetermined information from the nozzle 150 through the second power line communication corresponding thereto. According to the example embodiment, the information transmitted and received through the first power line communication and the second power line communication performed at a predetermined time interval may include various information indicating the operating state of the second motor 170 and/or the cleaning part 180 of the nozzle 150.

Figure 3:
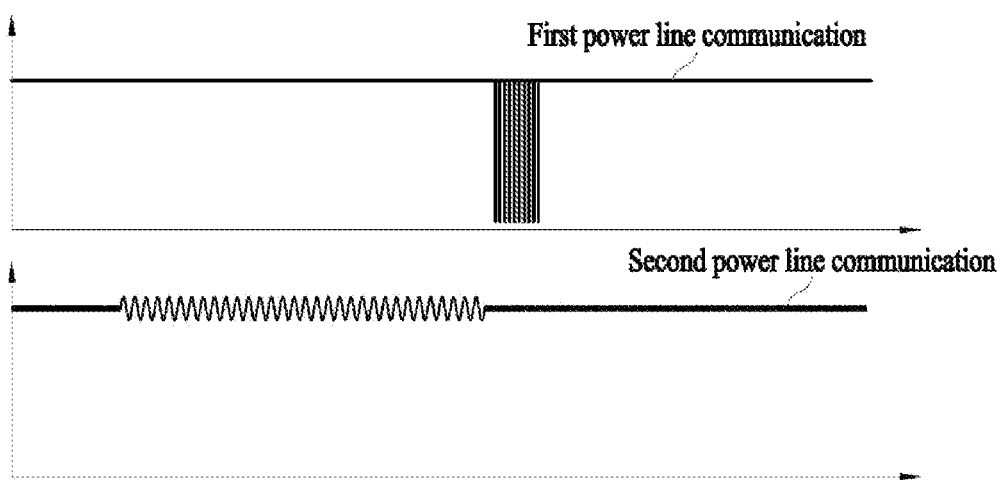
FIG. 3 illustrates a process of transmitting a signal from the main body to the nozzle through the first power line communication when a signal is transmitted from the nozzle to the main body through the second power line communication according to an example embodiment.

FIG. 3 illustrates a process of transmitting a signal from the main body 100 to the nozzle 150 through the first power line communication when a signal is transmitted from the nozzle 150 to the main body 100 through the second power line communication according to the example embodiment.

According to the example embodiment, the second controller 162 may perform the second power line communication for transmitting information indicating the current state of the nozzle 150 to the first controller 112. According to the example embodiment, the first controller 112 that receives the information indicating the current state of the nozzle 150 through the second power line communication may perform the first power line communication in order to analyze the current state of the nozzle 150 to control the operation of the second controller 162 and/or the cleaning part 180 included in the nozzle 150. According to the example embodiment, a process in which the second controller 162 transmits information indicating the current state of the nozzle 150 to the first controller 112 through the second power line communication may be performed at an arbitrary or predetermined time interval. According to the example embodiment, the process in which the second controller 162 transmits information indicating the current state of the nozzle 150 to the first controller 112 through the second power line communication may be performed when a state change occurring in the second motor 170 and/or the cleaning part 180 of the nozzle 150 is recognized and a predetermined condition is satisfied. For example, when determining that the current flowing through the second motor 170 is equal to or greater than a critical current value, the second controller 162 may transmit information on the state of the nozzle 150 to the first controller 112 by performing the second power line communication.

Figure 4:
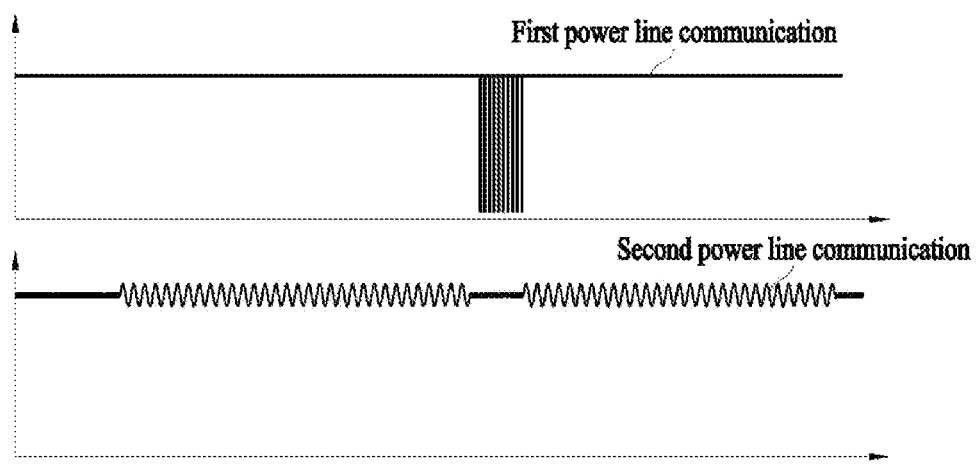
FIG. 4 illustrates a process in which the main body and the nozzle continuously communicate through the first power line communication and the second power line communication according to an example embodiment.

FIG. 4 illustrates a process in which the main body 100 and the nozzle 150 continuously communicate through a first power line communication and a second power line communication according to the example embodiment.

According to the example embodiment, the first controller 112 and the second controller 162 may continuously transmit/receive signals through the first power line communication and the second power line communication. That is, the transmission of a predetermined signal between the first controller 112 and the second controller 162 may be performed based on information received through power line communication of the other party. Referring to FIG. 4, according to the example embodiment, the second controller 162 may transmit information on the state of the nozzle 150 to the first controller 112 through the second power line communication. According to the example embodiment, the first controller 112 that received the information on the state of the nozzle 150, based on the information on the state of the nozzle 150, may transmit a predetermined signal (for example, a signal for changing the operating state of the second controller 170 and/or the cleaning part 180 based on the information on the state of the nozzle 150) to the second controller 162 through the first power line communication. According to the example embodiment, the second controller 162 that received the above predetermined signal through the first power line communication may transmit an acknowledge signal indicating that a predetermined signal is received, a signal indicating that the operation state of the nozzle 150 is changed based on the received predetermined signal, and a signal indicating that the operation state of the nozzle 150 cannot be changed based on the received predetermined signal to the first controller 112 through the second power line communication. As such, the first power line communication and the second power line communication may perform an operation control process between the main body 100 and the nozzle 150 by transmitting each signal to the other party in the time division communication method.

Figure 5:
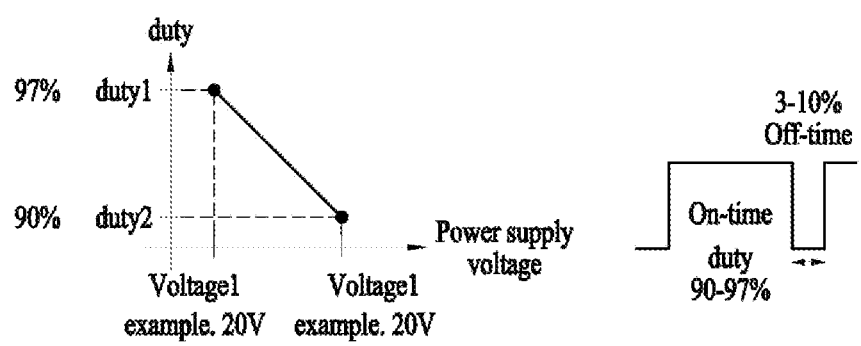
FIG. 5 is a diagram for illustrating a voltage compensation algorithm of a power supply part for compensating a voltage supplied to the nozzle according to a decrease in a voltage of the power supply part according to an example embodiment.

FIG. 5 is a diagram for illustrating a voltage compensation algorithm of a power supply part for compensating a voltage supplied to the nozzle according to a decrease in a voltage of the power supply part 130 according to an example embodiment.

According to the example embodiment, in performing a voltage PWM, the first controller 112 may stably control the second motor 170 by adjusting the voltage supplied to the second PCB 160 included in the nozzle 150 based on the change in the voltage of the power supply part 130, and the first controller 112 may perform a voltage compensation algorithm of the power supply part 130 that secures the maximum duty rate to perform power line communication adaptive to the magnitude of the input voltage of the power supply part 130 for the second power line communication. According to the example embodiment, when the voltage supplied from the power supply part 130 is low, the first controller 112 may increase the voltage supplied to the nozzle 150 by increasing the duty rate when the voltage PWM is performed.

According to the example embodiment, when the voltage supplied from the power supply part 130 is high, the first controller 112 may reduce the voltage supplied to the nozzle 150 by reducing the duty rate when the voltage PWM is performed. As such, the first controller 112 may secure the performance of the first power line communication by adaptively adjusting the duty rate of the voltage supplied to the nozzle 150 through the first power line communication to the voltage of the power supply part 130.

Referring to FIG. 5, when the voltage from the power supply part 130 is 20 V, the first controller 112 may perform the voltage PWM by setting the duty rate as high as 97%, and when the voltage from the power supply part 13 is 30 V, the first controller 112 may perform the voltage PWM by setting the duty rate as low as 90%. According to the example embodiment, the first controller 112 may adjust the voltage and the duty rate of the power supply part 130 according to preset slope S.

According to the example embodiment, referring to FIG. 5, the voltage and the duty rate of the power supply part 130 is controlled according to slope S of −2.73047, and the first controller 112 may perform the voltage PWM with a duty rate calculated based on the voltage and slope S of the power supply part 130. However, the voltage compensation algorithm of the power supply part performed by the first controller 112 does not need to be interpreted as being limited to the values of voltage, duty rate and slope of FIG. 5 and the above-described example embodiment. Various example embodiments capable of adjusting the duty rate during the voltage PWM based on the voltage of the power supply part 130 may be broadly interpreted as being included therein.

According to the example embodiment, the first controller 112 may perform a compensation algorithm for securing the second power line communication for each condition related to the current input performance or the frequency of the input signal.

Figure 6:
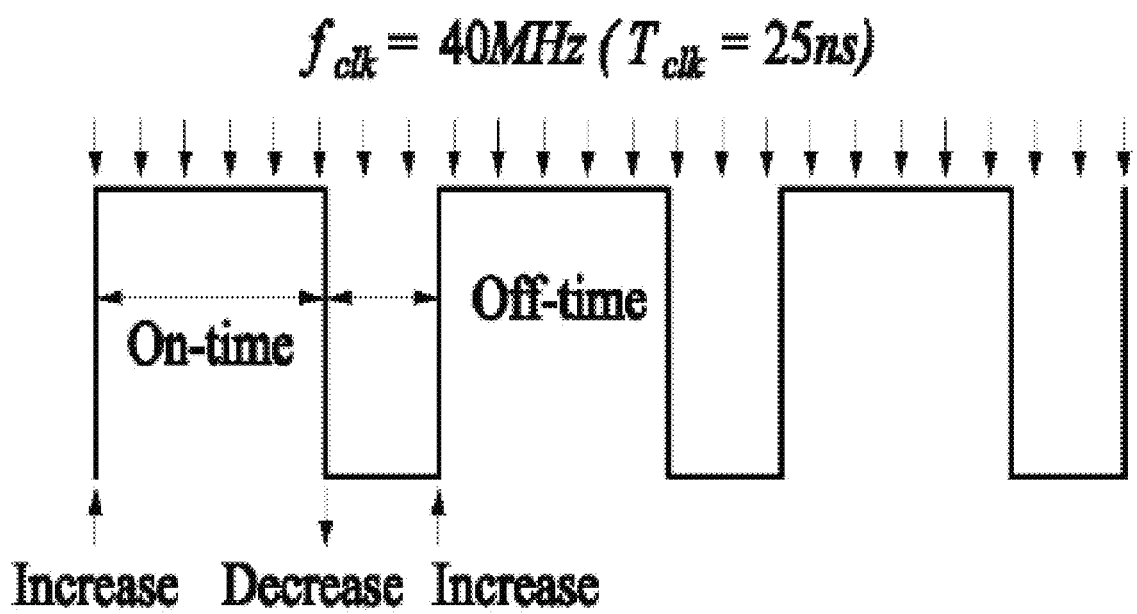
FIG. 6 is a diagram for explaining a process in which the second controller determines a pulse width of a voltage of a signal received through the first power line communication, according to an example embodiment.

FIG. 6 is a diagram for explaining a process in which the second controller determines a pulse width of a voltage of a signal received through the first power line communication, according to an example embodiment.

According to the example embodiment, the second controller 162 may measure the frequency of the voltage PWM signal received through the first power line communication. According to the example embodiment, the second controller 162 may measure a time interval between the times when the input voltage is changed. According to the example embodiment, the second controller 162 may determine the pulse width of the received signal based on how many times the clock signal is counted between the times when the received voltage PWM signal is changed. According to the example embodiment, the second controller 162 may be configured to determine the duty rate of the received voltage PWM signal based on the number of clock signals counted between the times that the input voltage is changed.

According to the example embodiment, the second controller 162, with regard to the pulse width and/or frequency value of the received voltage PWM signal, may measure the on-time from the time of a rising edge to the time of a falling edge, the off-time from the time of the falling edge to the time of the rising edge, or a period in which the on-time and the off-time are summed. Accordingly, the second controller 162 may determine the pulse width and/or frequency of the voltage PWM signal received in the second controller 162 based on at least one among the measured on-time, the measured off-time and the summed period of the on-time and the off-time.

Figure 7:
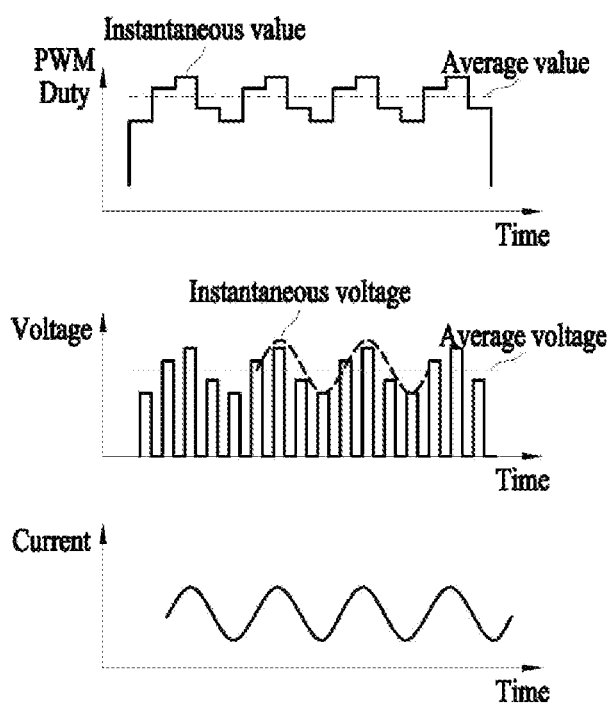
FIG. 7 illustrates graphs for illustrating a method for the second controller to perform power line communication and control the speed of the second motor when the second motor is a direct current (DC) motor according to an example embodiment.

FIG. 7 illustrates graphs for illustrating a method for the second controller 162 to perform power line communication and control the speed of the second motor 170 when the second motor 170 is a DC motor according to an example embodiment.

According to the example embodiment, the DC motor may be controlled in such a way that the DC motor has a change in PWM duty with time. According to the example embodiment, the rotation speed of the DC motor may be determined according to the input voltage of the second motor 170 determined based on the average value of the PWM duty. According to the example embodiment, when the magnitude of the input voltage of the second motor 170 is low, the low magnitude of the input voltage may be compensated by increasing the average value of the PWM duty. According to the example embodiment, the second controller 162 may be configured to increase the average value of the PWM duty in order to increase the rotation speed of the DC motor.

According to the example embodiment, the second controller 162 determines the frequency for the second power line communication based on an instantaneous value of the PWM duty. According to the example embodiment, the second controller 162 controls the speed of the second motor 170 by controlling the average value of the voltage input to the second motor 170, and the second controller 162 may perform second power line communication through frequency modulation of a current caused by controlling an instantaneous value of a voltage input to the second motor 170. Even if the voltage input to the second motor 170 is constant, if the duty change of the voltage is used, the second controller 162 may control each of the average value of the voltage input to the second motor 170 and the frequency change of the current input to the second motor 170. Thus, it is possible to control the operation of the second motor 170 and simultaneously perform second power line communication.

Figure 8:
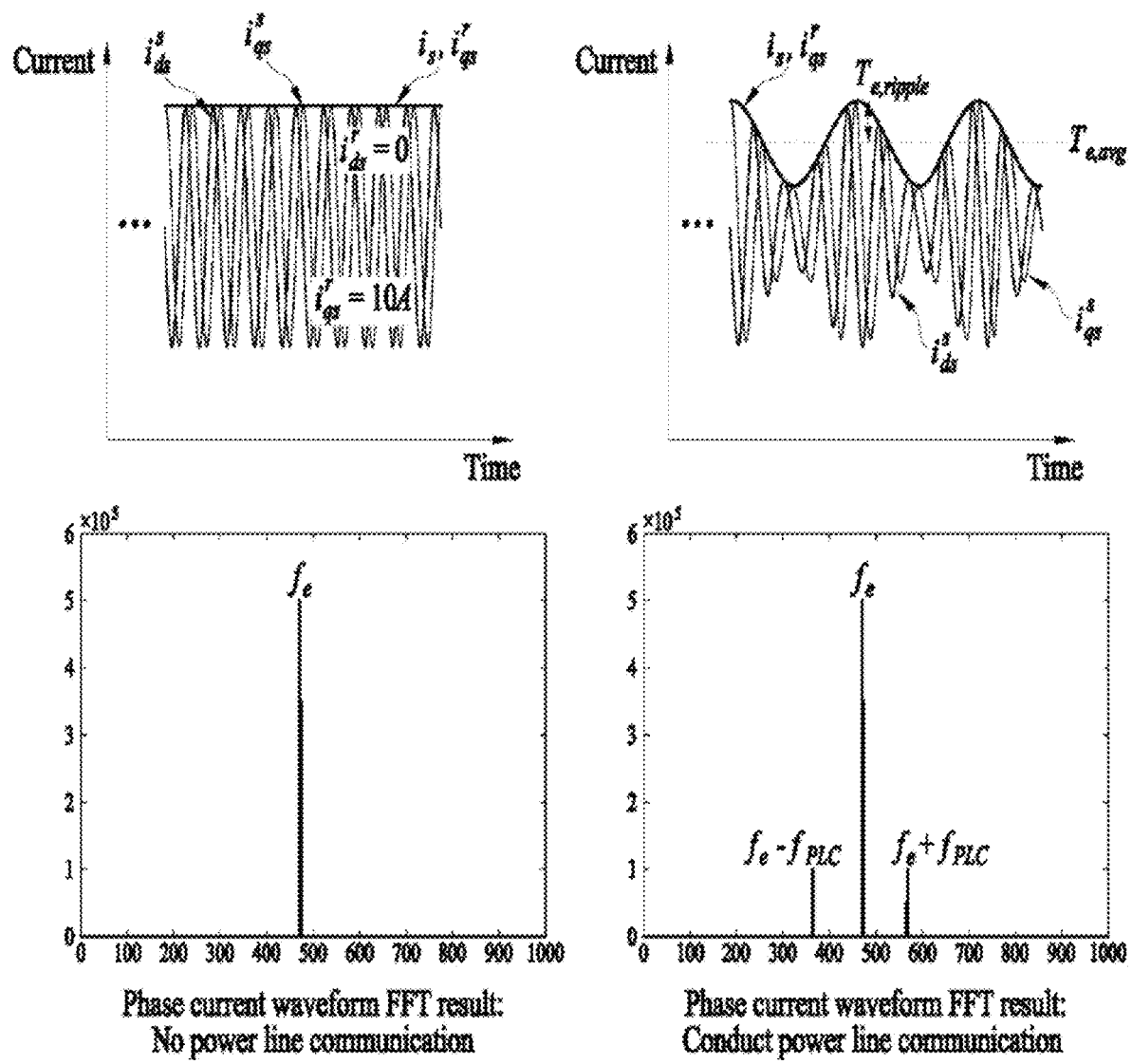
FIG. 8 illustrates graphs for illustrating a method for the second controller to perform power line communication and control the speed of the second motor when the second motor is an alternating current (AC) motor, according to an example embodiment.

FIG. 8 illustrates graphs for illustrating a method for the second controller 170 to perform power line communication and control the speed of the second motor 170 when the second motor 170 is an AC motor, according to an example embodiment.

Referring to FIG. 8, the second controller 162 may implement power line communication of a current shaping method by injecting current (or torque) ripples when inputting current to an AC motor (i.e., an AC motor) and generating a signal of the AC component, not DC, as the power line current.

According to the example embodiment, the second controller 162 may use a method of generating a signal to be transmitted through power line communication based on the magnitude and frequency of the Q-axis current that directly causes the change in output torque between the Q-axis current for controlling the output torque of the second motor 170 and the D-axis current for controlling the magnetic flux of the second motor 170.

According to the example embodiment, as the frequency change of the phase current of the second motor 170 occurs due to whether the second controller 162 performs the second power line communication, an overlapping waveform including a harmonic component generated in the phase current of the second motor 170 may appear.

According to the example embodiment, the frequency of the current having separate phases (a, b and c) may include two frequency components (i.e., second and third frequency components) generated by a first frequency component determining the driving speed of the second motor 170 and the frequency component injected for the second power line communication. According to the example embodiment, the remaining harmonic components (for example, distortion components by phase current measurement method of a 1-shunt, PWM switching) may be further included.

According to the example embodiment, the second and third frequency components injected for the second power line communication may be determined by subtracting or adding a power line frequency value from the first frequency component. According to the example embodiment, the magnitude of the frequency used for a current shaping in the second power line communication is less than the magnitude of the driving frequency of the second motor 170.

According to the example embodiment, the relationship between the first, second and third frequency components may correspond to the relationship shown in Equation 1 below. According to the example embodiment, in power spectrum analysis, as for a power density value, the first frequency component may be the largest, the second and third frequency components may have smaller values than the first frequency component, and other harmonic components may have smaller values than values of the sizes of the second and third frequency components.

$$\begin{aligned} i_{as,PLC} &= \sin(2\pi f_e t)\{A + B\sin(2\pi f_{PLC} t)\} \\ &= A\sin(2\pi f_e t) + B\sin(2\pi f_e t)\sin(2\pi f_{PLC} t) \\ &= A\sin(2\pi f_e t) + B\{\cos 2\pi (f_e - f_{PLC})t - \\ &\quad \cos 2\pi (f_e + f_{PLC})t\} \end{aligned} \quad \text{[Equation 1]}$$

Here, $f_e$ indicates a first frequency that is a driving frequency of the second motor 170, and $f_{PLC}$ indicates a frequency injected for the second power line communication.

Figure 9:
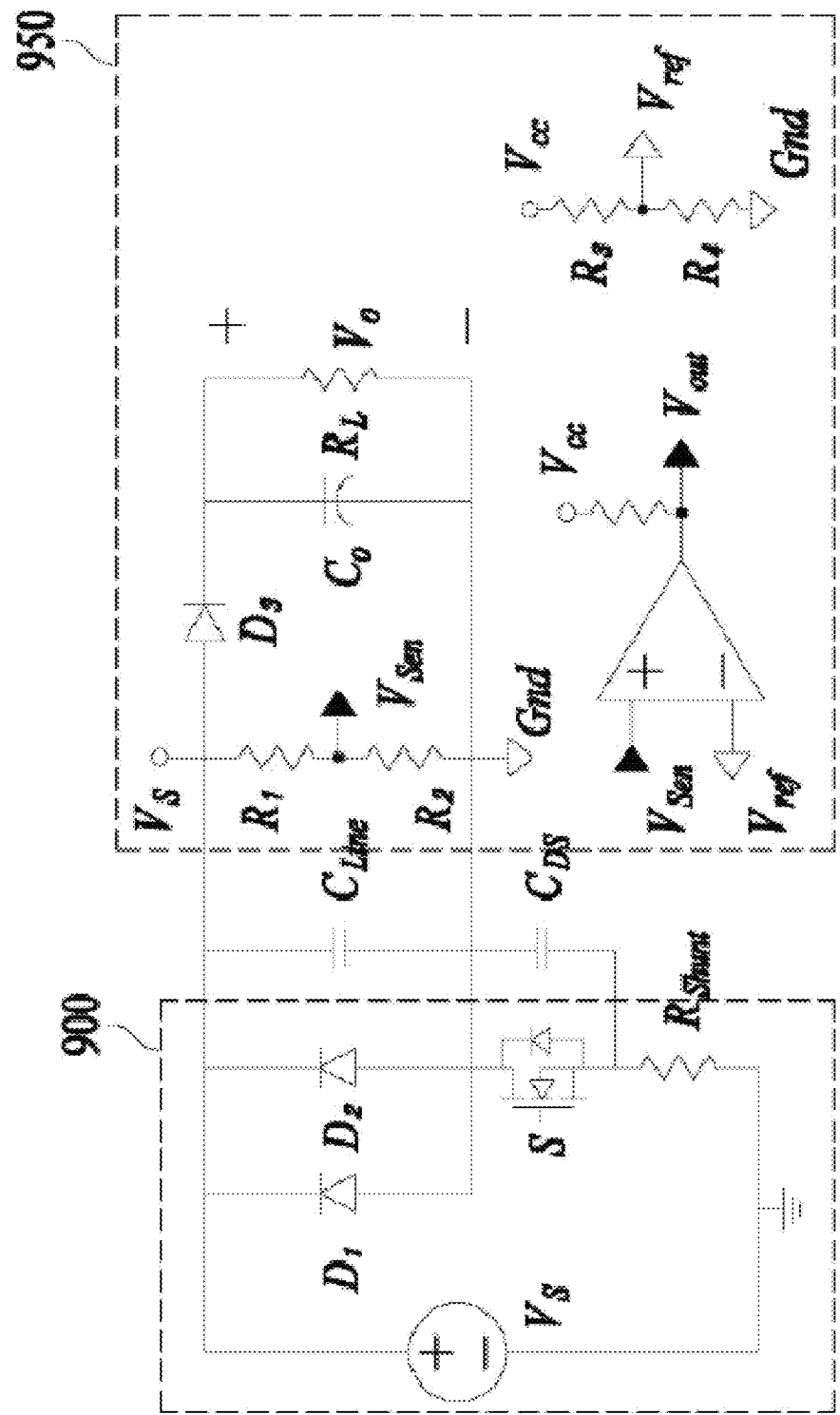
FIG. 9 illustrates a constitution of a circuit included in a second PCB of the nozzle that receives a signal through the first power line communication according to an example embodiment.

FIG. 9 illustrates a constitution of a circuit included in a second PCB 950 of the nozzle 150 that receives a signal through the first power line communication according to an example embodiment. According to the example embodiment, a first PCB 900 and the second PCB 950 may correspond to the first PCB 110 and the second PCB 160 illustrated in FIG. 1, and may be spaced apart from each other. According to the example embodiment, components such as $C_{Line}$ and $C_{DS}$ illustrated in FIG. 9 may be understood as parasitic components present between the first PCB 900 and the second PCB 950.

According to the example embodiment, the first PCB 900 including the first controller 112 may include a switching element (for example, metal-oxide-semiconductor field-effect (MOSFET) transistors) for supplying an average voltage value to the second PCB 950 including the second controller 162 through the first power line communication using the voltage PWM method, as power source.

According to the example embodiment, the first PCB 900 may include diode (D3) for forcing the direction of the current in order to prevent deterioration of the reliability of capacitor $C_o$ caused by the flow of the large-capacity charge/discharge current by the voltage PWM.

According to the example embodiment, the first PCB 900 may include distribution resistors R1 and R2 for reducing the voltage of the power supply part 130 to the level of the supply voltage of the second controller 162.

According to the example embodiment, the first PCB 900 may include division resistors R3 and R4 that make a reference voltage of a comparator. According to the example embodiment, in the second PCB 950, analog voltage signal $V_{sen}$ input to the comparator through the reference voltage of the comparator may be converted into digital signal $V_{out}$ in the form of a pulse. According to the example embodiment, the pulse width of the signals converted to a pulse form may be measured through a module function of a timer counter or an encoder in the second controller 162.

According to the example embodiment, signal $V_{out}$ converted from a voltage PWM signal, which is analog voltage signal $V_{sen}$ into a digital signal, may be connected to a pin configured to cause the second controller 162 to perform the above-described example embodiments.

Figure 10:
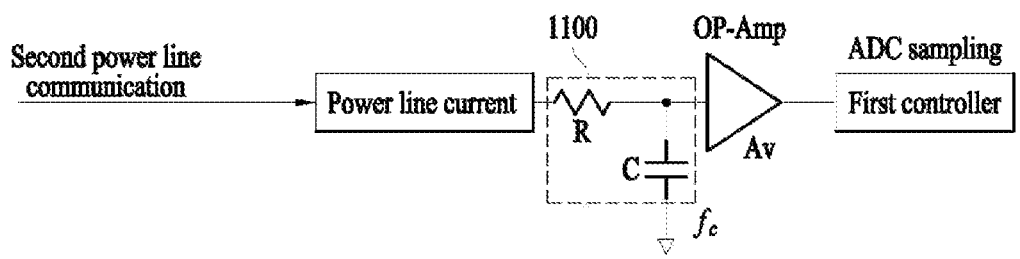
FIG. 10 is a diagram for illustrating a characteristic in which a signal received through the second power line communication is filtered through a filter included in the first PCB of the main body of the vacuum cleaner according to an example embodiment.

FIG. 10 is a diagram for illustrating a characteristic in which a signal received through the second power line communication is filtered through a filter included in the first PCB 160 of the main body 100 of the vacuum cleaner 10 according to an example embodiment.

Referring to FIG. 10, according to the example embodiment, when the main body 100 receives a signal through the second power line communication, a frequency component used for the second power line communication may pass through a filter 1100. According to the example embodiment, the signal input to the first controller 112 through an operational amplifier (OP-Amp) circuit may sense the frequency of the current received through the second power line communication through high-speed analog-to-digital conversion (ADC) sampling.

According to the example embodiment, it may be designed by minimizing the difference between the power line communication frequency and cutoff frequency $f_c$ of the filter so that the maximum frequency value for power line communication is not attenuated by −3 dB or more. According to the example embodiment, a range of a communication frequency at which the first controller 112 may receive predetermined information through the second power line communication may be 100 Hz to 400 Hz, and cutoff frequency G of the filter 1100 may be 500 Hz.

According to the example embodiment, in the situation of power line communication using a low frequency, communication may be difficult because the attenuation rate of a signal is relatively large. According to the example embodiment, a time constant value based on R and C included in the filter 1100 may be preset so that the frequency used for power line communication may be passed using the filter 1100, and other frequency components (for example, the PWM switching frequency, and the current fluctuation frequency by a phase current measurement method (1-shunt)) may be blocked.

According to the example embodiment, recognition of simple information such as a state of installation/removal of the nozzle 150 or an abnormal state such as constraint/failure may be performed through low-speed ADC sampling of a several milliseconds level, and when a relatively large amount of data is transmitted/received through the second power line communication, relatively high-speed ADC sampling may be performed to detect the frequency of the received current.

According to the example embodiment, even when the first controller 112 and/or the second controller 162 have low specifications, it is possible to shorten and minimize the execution time through optimizing the code for power line communication. Thus, components of the first PCB 160 that receives information through the second power line communication may be implemented at low cost.

According to the example embodiment, the vacuum cleaner 10 may further include a computer-readable recording medium or memory (not illustrated) for recording programs for performing the various methods described above. The power line communication methods of the vacuum cleaner 10 for the present disclosure described above may be provided by being recorded in a computer-readable recording medium as a program for execution by a computer.

The method of the present disclosure may be executed through software. When executed in software, the component parts of the present disclosure are code segments which perform necessary tasks. The program or the code segments may be stored on a processor-readable medium.

The computer-readable recording medium includes all kinds of recording devices in which data readable by a computer system is stored. Examples of the computer-readable recording device include a read only memory (ROM), a random access memory (RAM), a compact disc (CD)-ROM, a digital versatile disc (DVD)±ROM, DVD-RAM, a magnetic tape, a floppy disk, a hard disk, and an optical data storage device. The computer-readable recording medium may also be distributed in a computer device connected via a network so that a computer-readable code may be stored and executed in a distributed manner.

The above-described present disclosure may be variously substituted, modified, and changed within the technical spirit of the present disclosure without departing from the scope by those skilled in the art to which the present disclosure pertains and is not limited to the above-described example embodiments and the accompanying drawings. In addition, the example embodiments described herein may not be limitedly applied and all or some of each embodiment may be selectively combined so that various modifications may be made.

For those of ordinary skill in the art to which the present disclosure pertains, various substitutions, modifications and changes are possible within the scope of the example embodiments without departing from the technical spirit of the example embodiment. Thus, the present disclosure is not limited to the above-described example embodiments and the accompanying drawings.

The invention claimed is:

1. A vacuum cleaner, comprising:
   a main body comprising a power supply configured to supply power, a first motor configured to generate suction force, and a first printed circuit board (PCB) including a first controller; and
   a nozzle comprising a cleaning head, a second motor configured to drive the cleaning head and a second PCB equipped with a second controller, the nozzle being configured to suck air containing foreign substances by the suction force,
   wherein a first power line communication from the first controller to the second controller uses voltage pulse width modulation (PWM), and a second power line communication from the second controller to the first controller uses current shaping.

2. The vacuum cleaner of claim 1, wherein the first power line communication includes modulating a frequency of a voltage transmitted from the first controller to the second controller.

3. The vacuum cleaner of claim 1, wherein the second power line communication includes modulating at least one of a magnitude or a frequency of a current transmitted from the second controller to the first controller.

4. The vacuum cleaner of claim 1, wherein the first controller is configured to control at least one of an operation of the second motor or an operation of the cleaning head through the first power line communication.

5. The vacuum cleaner of claim 1, wherein the second controller is configured to transmit at least one of operation state information of the second motor, operation state information of the cleaning head, or information indicating that control operation received from the first controller is completed, to the first controller through the second power line communication.

6. The vacuum cleaner of claim 1, wherein the first controller is configured to adjust a duty rate of a voltage PWM signal input to the nozzle to compensate for decrease in a magnitude of a voltage of the power supply.

7. The vacuum cleaner of claim 6, wherein the first controller is configured to adjust the duty rate of the voltage PWM signal in inverse proportion to the magnitude of the voltage of the power supply.

8. The vacuum cleaner of claim 1, wherein the second controller is configured to determine a duty rate of a received voltage based on a number of clock signals counted between times of a change of an input voltage.

9. The vacuum cleaner of claim 1, wherein the first PCB further comprises a filter for filtering a signal received through the second power line communication, and
wherein the filter is a low pass filter for passing a frequency band used in the second power line communication.

10. The vacuum cleaner of claim 1, wherein the second motor is a direct current (DC) motor, and
wherein the second controller is configured to perform the second power line communication based on an instantaneous value of a voltage input to the second motor.

11. The vacuum cleaner of claim 10, wherein the second controller is configured to drive the second motor based on an average value of voltages input to the second motor.

12. The vacuum cleaner of claim 1, wherein the second motor is an alternating current (AC) motor, and
wherein the second controller is configured to perform the second power line communication by adding a current ripple to a current input to the second motor to change a magnitude and a frequency of a driving current of the AC motor from a direct current (DC) component signal to an AC component signal.

13. The vacuum cleaner of claim 1, wherein the first controller is configured to perform the first power line communication based on a trigger signal, and
wherein the trigger signal includes at least one of a signal input by a user or a recognition signal generated by a state change of the vacuum cleaner.

14. The vacuum cleaner of claim 13, wherein the second controller is configured to perform the second power line communication in order to transmit information indicating a performance state of an operation corresponding to information received through the first power line communication.

15. The vacuum cleaner of claim 1, wherein the first controller is configured to perform the first power line communication at a predetermined time interval, and
wherein the second controller is configured to perform the second power line communication in order to transmit information indicating a performance state of an operation corresponding to information received through the first power line communication.

16. A method for operating a vacuum cleaner having a main body comprising a power supply configured to supply power, a first motor configured to generate suction force, and a first printed circuit board (PCB) including a first controller, and a nozzle comprising a cleaning head, a second motor configured to drive the cleaning head and a second PCB equipped with a second controller, the nozzle being configured to suck air containing foreign substances by the suction force, the method comprising:
generating a first power line communication from the first controller to the second controller using voltage pulse width modulation (PWM); and
generating a second power line communication from the second controller to the first controller using current shaping.

17. The method of claim 16, wherein generating the first power line communication includes modulating a frequency of a voltage transmitted from the first controller to the second controller.

18. The method of claim 16, wherein generating the second power line communication includes modulating at least one of a magnitude or a frequency of a current transmitted from the second controller to the first controller.

19. The method of claim 16, wherein generating the first power line communication includes adjusting, by the first controller, a duty rate of a voltage PWM signal input to the nozzle to compensate for decrease in a magnitude of a voltage of the power supply.

20. The method of claim 16, wherein generating the second power line communication includes determining, by the second controller, a duty rate of a received voltage based on a number of clock signals counted between times of a change of an input voltage.

* * * * *